(12) United States Patent
Chen et al.

(10) Patent No.: US 8,951,837 B2
(45) Date of Patent: Feb. 10, 2015

(54) SUBMICRON CONNECTION LAYER AND METHOD FOR USING THE SAME TO CONNECT WAFERS

(75) Inventors: Kuan-Neng Chen, Hsinchu (TW); Yao-Jen Chang, Taipei (TW)

(73) Assignee: National Chiao Tung University, Hsinchu (TW)

(*) Notice: Subject to any disclaimer, the term of this patent is extended or adjusted under 35 U.S.C. 154(b) by 266 days.

(21) Appl. No.: 13/605,849

(22) Filed: Sep. 6, 2012

(65) Prior Publication Data
US 2014/0008801 A1    Jan. 9, 2014

(30) Foreign Application Priority Data
Jul. 6, 2012  (TW) .............................. 101124384 A

(51) Int. Cl.
*H01L 21/00*   (2006.01)
*H01L 21/30*   (2006.01)
*H01L 21/46*   (2006.01)

(52) U.S. Cl.
USPC ................... 438/107; 438/455; 257/E21.088; 257/E21.507

(58) Field of Classification Search
None
See application file for complete search history.

(56) References Cited

U.S. PATENT DOCUMENTS

| | | | | |
|---|---|---|---|---|
| 6,969,667 | B2* | 11/2005 | Liebeskind et al. | 438/455 |
| 2003/0193094 | A1 | 10/2003 | Takahashi et al. | |
| 2004/0067604 | A1* | 4/2004 | Ouellet et al. | 438/108 |
| 2012/0115305 | A1 | 5/2012 | Peng et al. | |

FOREIGN PATENT DOCUMENTS

TW             201039416 A        1/2010

* cited by examiner

*Primary Examiner* — Calvin Choi
(74) *Attorney, Agent, or Firm* — Muncy, Geissler, Olds & Lowe, P.C.

(57) ABSTRACT

A submicron connection layer and a method for using the same to connect wafers is disclosed. The connection layer comprises a bottom metal layer formed on a connection surface of a wafer, an intermediary diffusion-buffer metal layer formed on the bottom metal layer, and a top metal layer formed on the intermediary diffusion-buffer metal layer. The melting point of the intermediary diffusion-buffer metal layer is higher bottom metal layers may form a eutectic phase. During bonding wafers, two top metal layers are joined in a liquid state; next the intermediary diffusion-buffer metal layers are distributed uniformly in the molten top metal layers; then the top and bottom metal layers diffuse to each other to form a low-resistivity eutectic intermetallic compound until the top metal layers are completely exhausted by the bottom metal layers.

17 Claims, 5 Drawing Sheets

SUBMICRON CONNECTION LAYER AND METHOD FOR USING THE SAME TO CONNECT WAFERS

BACKGROUND OF THE INVENTION

1. Field of the Invention

The present invention relates to a wafer connection technology, particularly to a submicron connection layer and a method for using the same to connect wafers.

2. Description of the Related Art

The academia and industry have regarded the prominent 3D IC as the main measure to continue the Moore's law. TSV (Through Silicon Via) is a vertical metal interconnection to implement the high speed information transmission between the upper and lower elements inside a chip and has been a trend to fabricate chips. Wafer bonding is a critical step to integrate 3D IC, wherein wafers are aligned and bonded to each other, and wherein TSV realizes the layer-to-layer interconnections thereof. Many wafer bonding technologies are derived from the MEMS (microelectromechanical system) technology and the conventional package technology. However, a 3D IC wafer bonding platform is 5-10 times more precise than that of the MEMS or 3D integration technology. The alignment precision of final 3D IC products may reach the micron or even submicron scale.

The wafer bonding technology includes the silicon direct bonding methods, the metal-metal bonding methods, and the polymer adhesive bonding methods. The metal eutectic bonding method is one of the metal-metal boding methods, for example, the Cu—Sn eutectic bonding method. In the conventional Cu—Sn eutectic bonding method, the physics of the intermetallic compound would constrain the thickness of the connection layer to be in the scale of 3 μm. Besides, the roughened surface of the Cu—Sn intermetallic compound (IMC) degrades reliability of bonding.

Accordingly, the present invention proposes a novel submicron connection layer and a method for using the same to connect wafers in order to overcome the abovementioned problems.

SUMMARY OF THE INVENTION

The primary objective of the present invention is to provide a submicron connection layer and a method for using the same to connect wafers, which can achieve a yield of 100% at a temperature of as low as 200° C., whereby is reduced the influence of the bonding temperature on the elements of wafers, wherefore is promoted the reliability.

Another objective of the present invention is to provide a submicron connection layer and a method for using the same to connect wafers, wherein the thickness of the connection layer is in a submicron scale, whereby is decreased the RC time delay.

Yet another objective of the present invention is to provide a submicron connection layer and a method for using the same to connect wafers, wherein the top metal layer, the intermediary diffusion-buffer metal layer, and the bottom metal layer are fabricated with sputtering or vapor deposition in a single process, wherefore the present invention has a high productivity.

A further objective of the present invention is to provide a submicron connection layer and a method for using the same to connect wafers, which can reduce the Kirkendall effect, whereby is decreased the porosity and promoted the reliability.

To achieve the abovementioned objectives, the present invention proposes a submicron connection layer, which is formed on a connection surface of a wafer, and which comprises a bottom metal layer formed on the connection surface of the wafer, an intermediary diffusion-buffer metal layer formed on the bottom metal layer, and a top metal layer formed on the intermediary diffusion-buffer metal layer, wherein the melting point of the intermediary diffusion-buffer metal layer is higher than the melting points of the top metal layer and bottom metal layer, and wherein the materials of the top metal layer and bottom metal layer may form the eutectic phase.

The present invention also proposes a method for using a submicron connection layer to connect two wafers, which comprises steps: providing a first wafer and a second wafer; forming a connection layer on the connection surface of each wafer; and bonding the connection layers of the first and second wafers, wherein the connection layer comprises a top metal layer, an intermediary diffusion-buffer metal layer and a bottom metal layer, and wherein the melting point of the intermediary diffusion-buffer metal layer is higher than the melting points of the top metal layer and bottom metal layer, and wherein the materials of the top metal layer and bottom metal layer may form a eutectic phase. During the bonding process, the two top metal layers, which are separated from the bottom metal layers by the intermediary diffusion-buffer metal layers, are joined to each other in a liquid state; next the intermediary diffusion-buffer metal layers are distributed uniformly in the molten top metal layers; then the atoms of the bottom metal layers and the atoms of the top metal layers diffuse to each other to form the eutectic intermetallic compound until the top metal layers are completely exhausted by the bottom metal layer with the intermediary diffusion-buffer metal layers uniformly distributed in the intermetallic compound.

Below, embodiments are described in detail to make easily understood the objectives, technical contents, characteristics and accomplishments of the present invention.

DETAILED DESCRIPTION OF THE INVENTION

The present invention proposes a submicron connection layer and a method for using the same to connect wafers, wherein an intermediary diffusion-buffer metal layer is used to decelerate the diffusion between the top metal layer and the bottom metal layer, whereby the thickness of the connection layer between two wafers is reduced to a submicron scale, and whereby are overcome the conventional problem that the connection layer between two wafers has too great a thickness, and whereby is overcome the conventional problem that the intermetallic compound, which is form by the eutectic reaction of the top metal layers and the bottom metal layers, has a poor reliability.

Figure 1:
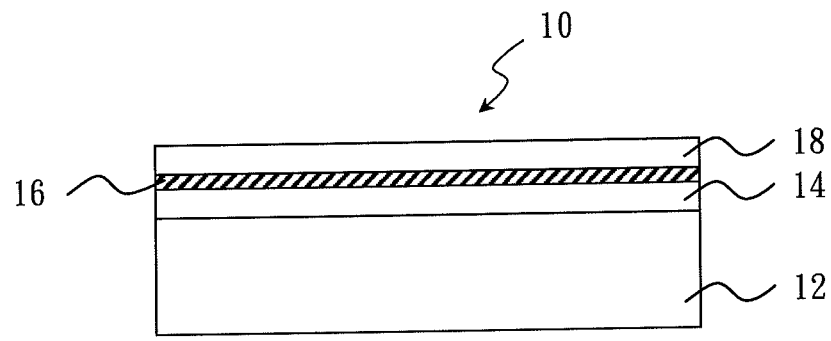
FIG. 1 is a sectional view schematically showing a submicron connection layer according to a first embodiment of the present invention.

Refer to FIG. 1 a sectional view of a submicron connection layer according to a first embodiment of the present invention. The submicron connection layer 10 is formed on a connection surface of a wafer 12 and comprises a bottom metal layer 14 formed on the connection surface of the wafer 12, an intermediary diffusion-buffer metal layer 16 formed on the bottom metal layer 14, and a top metal layer 18 formed on the intermediary diffusion-buffer metal layer 16. The melting point of the intermediary diffusion-buffer metal layer 16 is higher than the melting points of the top metal layer 18 and bottom metal layer 16. The materials of the top metal layer and bottom metal layer are selected from materials able to form a eutectic phase having physical and chemical properties different from the original materials.

The volume ratio of the top metal layer 18 and the bottom metal layer 14 is between 20 and 160%. The thickness of the intermediary diffusion-buffer metal layer 16 is 0-5% of the thickness of the submicron connection layer 10. The total thickness of the submicron connection layer 10, which contains the top metal layer 18, the intermediary diffusion-buffer metal layer 16 and the bottom metal layer 14, is less than 1.5 μm.

The material of the top metal layer 18 is tin, indium, lead, cadmium, cobalt, iron, zinc, chromium, manganese, titanium, tantalum, palladium, or bismuth. The material of the intermediary diffusion-buffer metal layer 16 is nickel, indium, lead, cadmium, cobalt, iron, zinc, chromium, manganese, titanium, tantalum, palladium, or bismuth. The material of the bottom metal layer 14 is copper, silver, aluminum, or gold.

In order to decrease the cost, tin, nickel and copper are respectively used as the materials of the top metal layer 18, the intermediary diffusion-buffer metal layer 16 and the bottom metal layer 14, in one embodiment.

Below is described a method for using submicron connection layers to connect wafers. An embodiment respectively using tin, nickel and copper as the materials of the top metal layer, the intermediary diffusion-buffer metal layer and the bottom metal layer is used to exemplify the method of the present invention.

Figure 2:
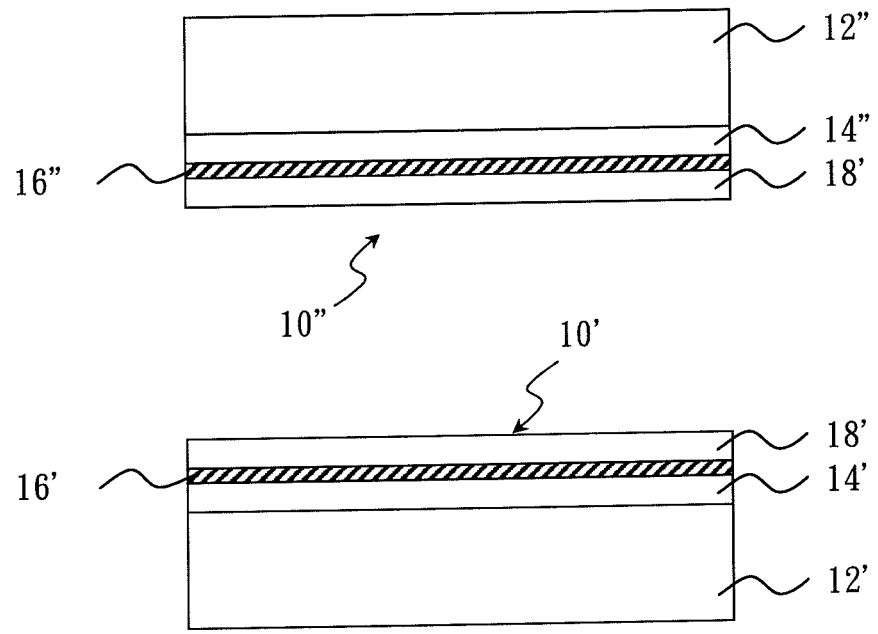
FIGS. 2(a)-2(c) are sectional views schematically showing the steps of a method for using a submicron connection layer to connect two wafers according to a second embodiment of the present invention.
Figure 2:
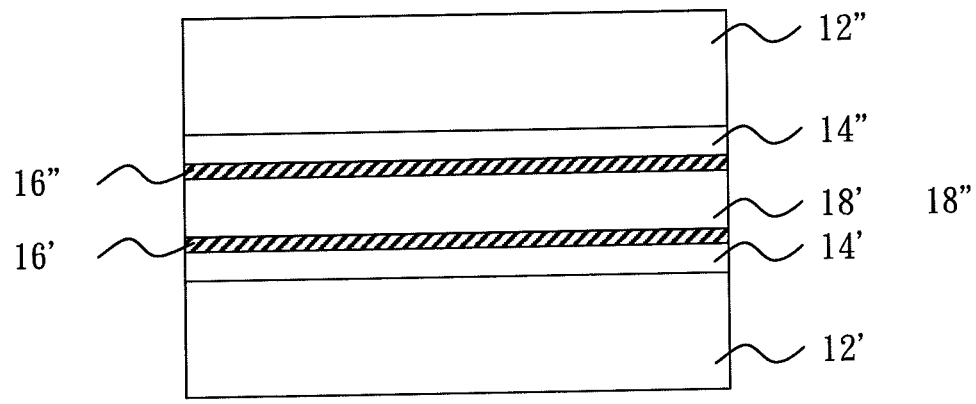
Figure 2:
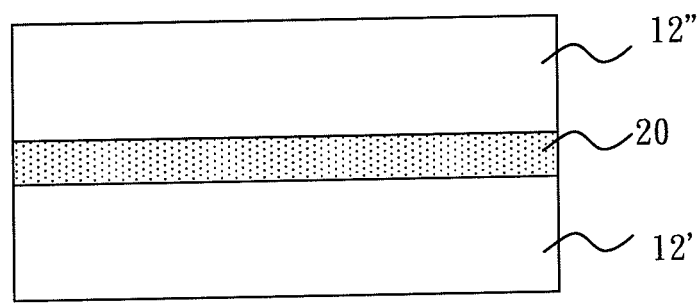

Refer to FIGS. 2(a)-2(c) sectional views schematically showing the steps of a method for using a submicron connection layer to connect two wafers according to a second embodiment of the present invention.

As shown in FIG. 2(a), provide a first wafer 12' and a second wafer 12". Active elements have been fabricated on the first wafer 12' and the second wafer 12". The surfaces of the first wafer 12' and the second wafer 12" have been cleaned to remove micro particles. A connection layer 10' and a connection layer 10" are respectively formed on the surfaces of the first wafer 12' and the second wafer 12", which are to be connected. For example, a vacuum metal sputtering system is used to sequentially deposit a 3000 A-thick copper layer as the bottom metal layer 14' or 14", a 100 A-thick nickel layer as the intermediary diffusion-buffer metal layer 16' or 16", and a 2000 A-thick tin layer as the top metal layer 18' or 18".

Next, bond the connection layer 10' to the connection layer 10". For example, a wafer bonding machine applies a force of 10 kN to the wafers and heats the wafers to a temperature of 250° C. at a temperature rising rate of 3° C./sec. The wafers are maintained at 250° C. for 30 minutes and then annealed at 250° C. in a nitrogen atmosphere for 30 minutes. In the beginning of the bonding process, the top metal layers 18' and 18" are joined to each other in a liquid state, separated from the bottom metal layers 14' and 14" by the intermediary diffusion-buffer metal layers 16' and 16", as shown in FIG. 2(b).

Next, the bottom metal layers 14' and 14" melt also. Meanwhile, the intermediary diffusion-buffer metal layers 16' and 16" are distributed in the molten top metal layers 18' and 18" and bottom metal layers 14' and 14". Compared with the top metal layers 18' and 18" and bottom metal layers 14' and 14", the intermediary diffusion-buffer metal layers 16' and 16" have a very small thickness and a very small amount. Therefore, the intermediary diffusion-buffer metal layers 16' and 16" are almost uniformly distributed in the molten top metal layers 18' and 18" and bottom metal layers 14' and 14". The atoms of the bottom metal layers 14' and 14" and the atoms of the top metal layers 18' and 18" diffuse to each other to form a eutectic intermetallic compound 20 until the top metal layers 18' and 18" are completely exhausted by the bottom metal layers 14' and 14", with the intermediary diffusion-buffer metal layers 16' and 16" uniformly distributed in the intermetallic compound 20, as shown in FIG. 2(c). The intermetallic compound 20 is expressed by a formula of CuSn and designated as the ∈-phase.

If the nickel layer has a thickness of 50-100 A, it can withstand the temperature of the wafer bonding machine for 15 minutes. The nickel layer provides sufficient time for the atom diffusion between the bottom metal layers and the top metal layers and thus favors the formation of the eutectic intermetallic compound having a low resistivity.

The present invention has the following advantages:

1. The present invention has a high productivity because the present invention can complete the top metal layer, the intermediary diffusion-buffer metal layer, and the bottom metal layer in a single deposition process with a sputtering machine or a vapor deposition machine.
2. The present invention can decrease the influence of the bonding temperature on the elements of the wafers and promote the reliability of the elements because the present invention can undertake the bonding process at a temperature of as low as 200° C.
3. The present invention can bond wafers with a submicron connection layer and thus can reduce the RC time delay.
4. The present invention can reduce the Kirkendall effect and thus can promote the reliability of bonding.

Figure 3:
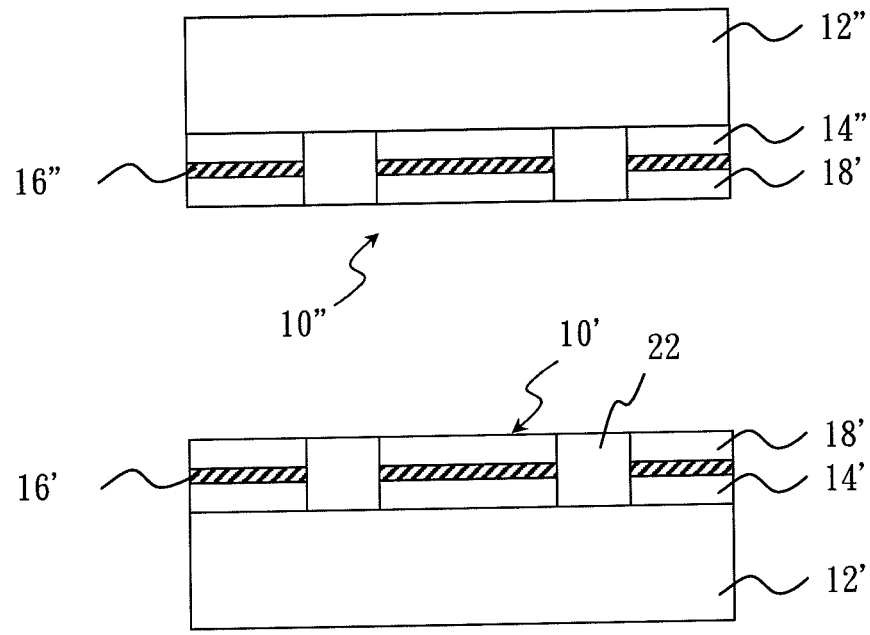
FIG. 3(a) and FIG. 3(b) are sectional views schematically showing the steps of a method for using a submicron connection layer to connect two wafers according to a third embodiment of the present invention.
Figure 3:
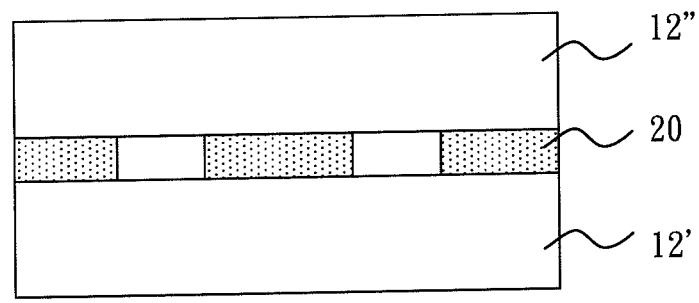

Refer to FIG. 3(a) and FIG. 3(b) sectional views schematically showing the steps of a method for using a submicron connection layer to connect two wafers according to a third embodiment of the present invention. The third embodiment is different from the second embodiment in that photolithographic, etching and deposition processes are performed on the two connection layers to form the dielectric regions 22 before two connection layers are bonded. In the third embodiment, the succeeding bonding process is identical to that of the second embodiment and will not repeat herein.

Figure 4:
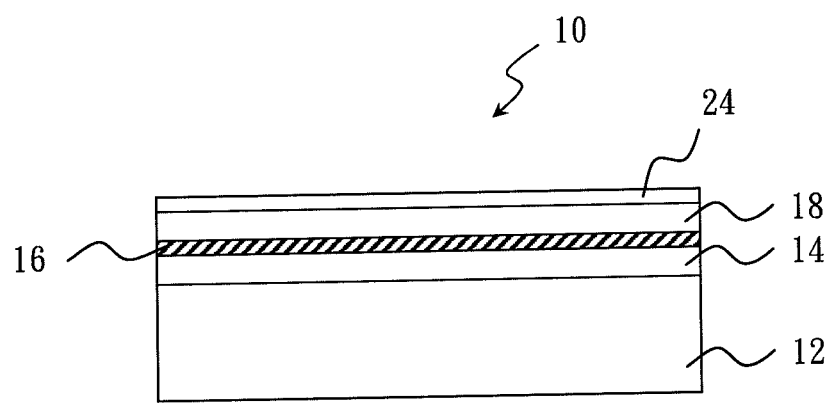
FIG. 4 is a sectional view schematically showing a submicron connection layer according to a fourth embodiment of the present invention.

Refer to FIG. 4 a sectional view of a submicron connection layer according to a fourth embodiment of the present invention. In the fourth embodiment, a surface metal layer 24 having a thickness of about 50 A is formed on the surface of the connection layer 10 with a semiconductor process to protect the top metal layer 18 from oxidization. In one embodiment, the material of the surface metal layer 24 is titanium, tantalum, palladium or bismuth.

Figure 5:
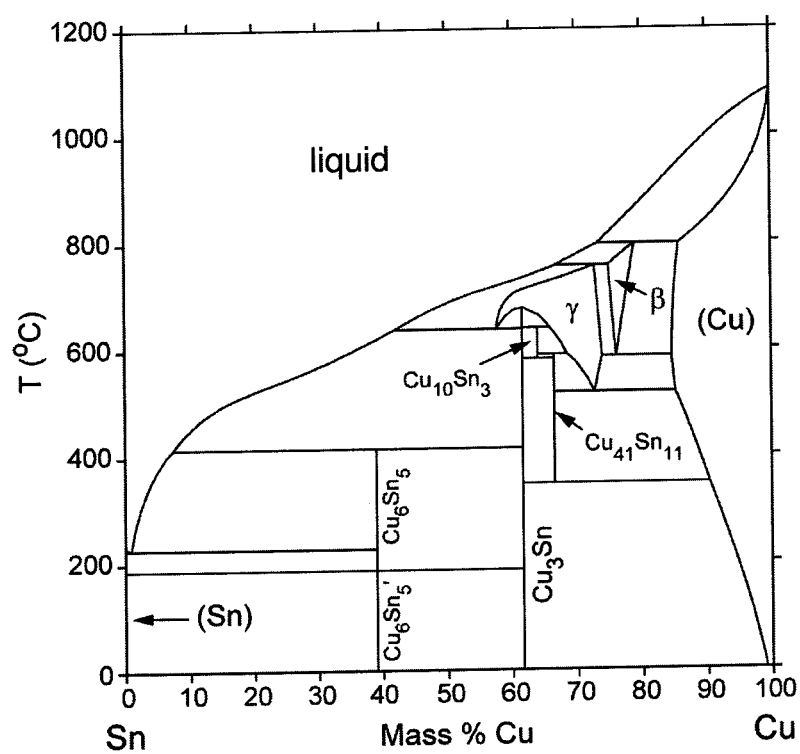
FIG. 5 is a phase diagram of copper-tin alloys.

Refer to FIG. 5, Table. 1 and Table. 2, which are used to explain the limitations on the thicknesses of the top metal layer (made of Sn) and the bottom metal layer (made of Cu). From the phase diagram of the Cu—Sn alloy shown in FIG. 5, it is observed that there are mainly two phases in the temperature range of 0-250° C. (considering the limitation on the bonding temperature). As shown in Table. 1, the ∈-phase has a lower resistivity and can be obtained via increasing the ratio of copper to tin. In order to achieve a submicron connection layer, the thicknesses of the copper layer and the tin layer are respectively controlled to be 3000 A and 2000 A.

TABLE 1

|  | Cu | Sn | ε (Cu$_3$Sn) | η (CU$_6$Sn$_5$) |
|---|---|---|---|---|
| Density (g/cm$^3$) | 8.95 | 7.286 | 11.33 | 8.26 |
| Molar Volume (cm$^3$/mole) | 7.1 | 16.29 | 9.7 | 11.8 |
| Resistivity (μΩ · cm) | 1.7 | 11.4 | 8.9 | 17.5 |
| Melting Point | 1084 | 231.9 | 675 | X |
| QD (KJ/mole) | ~195 | ~43 | ~70.7 | ~64.82 |
| QG (KJ/mole) at 50-125° C. | X | X | 90.4 | 41.4 |

Let the thickness of the copper layer be 3000 A fixedly, and vary the thickness of the tin layer from 1000 A to 5000 A. If the 1000 A and 2000 A thick tin layers are completely consumed, the residual copper layers respectively have thicknesses of 1.7 KA and 0.38 KA. If the thickness of the tin layer is further increased, the copper layer will be insufficient to completely consume the tin layer. In such a case, the high-resistivity η-phase intermetallic compound appears.

TABLE 2

| Cu/Sn | IMC phase | Thickness of Consumed Cu Layer | Thickness of Residual Cu Layer |
|---|---|---|---|
| 1000A Sn | ε-phase | 1.3 KA | 1.7 KA |
| 2000A Sn | ε-phase | 2.61 KA | 0.38 KA |
| 3000A Sn | η-phase | 1.56 KA | 1.43 KA |
| 4000A Sn | η-phase | 2.09 KA | 900 A |
| 5000A Sn | η-phase | 2.61 KA | 380 A |

The embodiments described above are only to exemplify the present invention but not to limit the scope of the present invention. Any equivalent modification or variation according to the characteristic or spirit of the present invention is to be also included within the scope of the present invention.

What is claimed is:

1. A method for using a submicron connection layer to connect two wafers, comprising:

Step (a): providing a first wafer and a second wafer;

Step (b): forming a connection layer on a connection surface of each of said first wafer and said second wafer, wherein said connection layer comprises a top metal layer, an intermediary diffusion-buffer metal layer and a bottom metal layer, and wherein a melting point of said intermediary diffusion-buffer metal layer is higher than melting points of said top metal layer and said bottom metal layer, and wherein materials of said top metal layer and said bottom metal layer form a eutectic phase; and Step (c): bonding said connection layer of said first wafer to said connection layer of said second wafer, wherein said top metal layers, which are separated from said bottom metal layers by said intermediary diffusion-buffer metal layers, are joined to each other in a liquid state to melt; next said top metal layer and said bottom metal layer of each of said first wafer and said second wafer are melting; said intermediary diffusion-buffer metal layers are distributed uniformly into said top metal layers and said bottom metal layers having melted; then said bottom metal layer and said top metal layer of said first wafer diffuse to each other until said top metal layer of said first wafer is completely exhausted by said bottom metal layer of said first wafer, and said bottom metal layer and said top metal layer of said second wafer diffuse to each other until said top metal layer of said second wafer is completely exhausted by said bottom metal layer of said second wafer to form a eutectic intermetallic compound having said intermediary diffusion-buffer metal layers uniformly distributed in said eutectic intermetallic compound.

2. The method for using the submicron connection layer to connect two wafers according to claim 1, wherein a volume ratio of said top metal layer to said bottom metal layer is 20-166%.

3. The method for using the submicron connection layer to connect two wafers according to claim 1, wherein said eutectic intermetallic compound has a thickness of less than 1.5 μm.

4. The method for using the submicron connection layer to connect two wafers according to claim 1, wherein before said Step (c), photolithographic, etching and deposition processes are performed on said connection layers to form dielectric regions and vertical interconnections.

5. The method for using the submicron connection layer to connect two wafers according to claim 1, wherein a thickness of said intermediary diffusion-buffer metal layer is greater than 0% but not greater than 5% of a thickness of said connection layer.

6. The method for using the submicron connection layer to connect two wafers according to claim 1, wherein a volume of said eutectic intermetallic compound is greater than 0% but not greater than 76% of a volume of two said connection layers.

7. The method for using the submicron connection layer to connect two wafers according to claim 1, wherein a material of said top metal layer is tin, indium, lead, cadmium, cobalt, iron, zinc, chromium, manganese, titanium, tantalum, palladium, or bismuth; a material of said intermediary diffusion-buffer metal layer is nickel, indium, lead, cadmium, cobalt, iron, zinc, chromium, manganese, titanium, tantalum, palladium, or bismuth; a material of said bottom metal layer is copper, silver, aluminum, or gold.

8. The method for using the submicron connection layer to connect two wafers according to claim 7, wherein said top metal layer is made of tin; said intermediary diffusion-buffer metal layer is made of nickel; said bottom metal layer is made of copper.

9. The method for using the submicron connection layer to connect two wafers according to claim 8, wherein in said Step (c), said first wafer and said second wafer are heated to a temperature of 250° C. at a temperature rising rate of 3° C./sec and then maintained at 250° C. for 30 minutes.

10. The method for using a submicron connection layer to connect two wafers according to claim 1, wherein said top metal layer, said intermediary diffusion-buffer metal layer, and said bottom metal layer are fabricated in a single deposition process with a sputtering machine or a vapor deposition machine.

11. The method for using the submicron connection layer to connect two wafers according to claim 1, wherein a surface metal layer is formed on a surface of said top metal layer to protect said top metal layer from oxidization.

12. The method for using the submicron connection layer to connect two wafers according to claim 1, wherein said submicron connection layer is formed on said connection surface wherein:
- said bottom metal layer is formed on said connection surface;
- said intermediary diffusion-buffer metal layer is formed on said bottom metal layer; and
- said top metal layer is formed on said intermediary diffusion-buffer metal layer, wherein a melting point of said intermediary diffusion-buffer metal layer is higher than melting points of said top metal layer and said bottom metal layer, and wherein materials of said top metal layer and said bottom metal layer form a eutectic phase.

13. The method for using the submicron connection layer to connect two wafers according to claim 12, wherein a volume ratio of said top metal layer to said bottom metal layer is 20-166%.

14. The method for using the submicron connection layer to connect two wafers according to claim 12, wherein a thickness of said intermediary diffusion-buffer metal layer is 0-5% of a thickness of said connection layer.

15. The method for using the submicron connection layer to connect two wafers according to claim 12, wherein a material of said top metal layer is tin, indium, lead, cadmium, cobalt, iron, zinc, chromium, manganese, titanium, tantalum, palladium, or bismuth; a material of said intermediary diffusion-buffer metal layer is nickel, indium, lead, cadmium, cobalt, iron, zinc, chromium, manganese, titanium, tantalum, palladium, or bismuth; a material of said bottom metal layer is copper, silver, aluminum, or gold.

16. The method for using the submicron connection layer to connect two wafers according to claim 15, wherein said top metal layer is made of tin; said intermediary diffusion-buffer metal layer is made of nickel; said bottom metal layer is made of copper.

17. The method for using the submicron connection layer to connect two wafers according to claim 12, wherein a surface metal layer is formed on a surface of said top metal layer to protect said top metal layer from oxidization.

\* \* \* \* \*